United States Patent
Puchner et al.

[11] Patent Number: 6,156,620
[45] Date of Patent: Dec. 5, 2000

[54] ISOLATION TRENCH IN SEMICONDUCTOR SUBSTRATE WITH NITROGEN-CONTAINING BARRIER REGION, AND PROCESS FOR FORMING SAME

[75] Inventors: Helmut Puchner, Santa Clara; Shih-Fen Huang, Los Altos; Sheldon Aronowitz, San Jose, all of Calif.

[73] Assignee: LSI Logic Corporation, Milpitas, Calif.

[21] Appl. No.: 09/121,283

[22] Filed: Jul. 22, 1998

[51] Int. Cl.$^7$ .................................................... H01L 21/76
[52] U.S. Cl. ............................. 438/400; 437/64; 437/67; 437/238; 438/296; 438/400; 438/437
[58] Field of Search ................................ 437/67, 64, 238; 438/296, 437, 400

[56] References Cited

U.S. PATENT DOCUMENTS 5,702,977 12/1997 Jang et al. .................................. 437/67
5,780,346 7/1998 Arghavani ................................ 438/296

OTHER PUBLICATIONS

Wolf, Stanley., *Silicon Processing for the VLSI Era*, 3 vols., (Sunset Beach, CA: Lattice Press, 1995), vol. 3: *The Submicron Mosfet*, pp. 224–225.

*Primary Examiner*—David Nelms
*Assistant Examiner*—Phuc Dang
*Attorney, Agent, or Firm*—John P. Taylor

[57] ABSTRACT

An isolation trench in a silicon semiconductor substrate is provided with a barrier region containing nitrogen atoms formed in the trench, contiguous with the silicon semiconductor substrate surfaces of the trench. The novel isolation trench structure of the invention is formed by forming an isolation trench in a silicon semiconductor substrate; forming in the isolation trench a barrier region by treating the trench structure with nitrogen atoms from a nitrogen plasma; and then forming a silicon oxide layer over the barrier region in the trench to confine the nitrogen atoms in the barrier region. In a preferred embodiment, a silicon oxide liner is first formed over the silicon semiconductor substrate surfaces of the trench, and then the trench structure is treated with nitrogen atoms from a nitrogen plasma to form, on the silicon semiconductor substrate surfaces of the trench, a barrier layer which contains silicon atoms, oxygen atoms, and nitrogen atoms.

17 Claims, 5 Drawing Sheets

6,156,620

ISOLATION TRENCH IN SEMICONDUCTOR SUBSTRATE WITH NITROGEN-CONTAINING BARRIER REGION, AND PROCESS FOR FORMING SAME

BACKGROUND OF THE INVENTION

1. Field of the Invention

This invention relates to integrated circuit structures. More particularly, this invention relates to the formation, in a semiconductor substrate, of an isolation trench having a barrier region therein containing nitrogen atoms to enhance the performance of the isolation trench in the semiconductor substrate.

2. Description of the Related Art

The continuous shrinking in size of integrated circuit structures on a semiconductor substrate, including the active regions of the integrated circuit structure, such as transistors, has resulted in the concurrent need to also reduce the size of isolation regions formed in the semiconductor substrate between such active regions to electrically separate the active regions from one another. Two of the most popular forms of such isolation regions which electrically isolate, for example, the transistors of an integrated circuit structure from one another, to prevent electrical current flow between the transistors, as well as to avoid malfunctioning of the devices, are the formation of isolation oxide regions such as LOCOS (Local Oxidation of Silicon), and STI (Shallow Trench Isolation).

For sub-micron technologies, the trench isolation technique (STI) is becoming more favored because of less space consumption and less lateral encroachment, which allows an increase in integration density and a decrease in devices spacing. However, S. Wolf in "Silicon Processing for the VLSI Era, Volume 3, The Submicron MOSFET" published by Lattice Press in 1995, states, on pages 224–225, that the use of a fully recessed oxide isolation such as a trench type isolation results in a decrease in threshold voltage ($V_T$) due to inverse narrow-width effect wherein when the gate of an MOS device is biased, the field lines from the overlapping region are focused by the edge geometry of the channel. He states that at the edges of the channel, an inversion layer is formed at lower voltages than at the center and, as a result, less overall bias must be applied to the gate to invert the channel across its full width.

He further states that such inverse-width effect is sensitive to the doping concentration in the sidewall of the silicon isolation trench.

The use of the trench isolation technique, formed with a conventional oxide liner, also can result in diffusion of dopants from the silicon semiconductor substrate into the isolation structure resulting in a depletion at the interface which can, in turn, result in field punchthrough.

It would, therefore, be desirable to provide an isolation trench for an integrated circuit structure in a semiconductor substrate wherein the decrease in threshold voltage from the inverse (or reverse) narrow-width effect would be reduced or mitigated and the field punchthrough protection would be improved by reduction in diffusion of the dopants in the silicon substrate adjacent to the isolation structure, whereby the interface concentration of dopants will be higher than the standard oxide liner where depletion occurs at the interface.

SUMMARY OF THE INVENTION

In accordance with the invention an improved isolation trench in a silicon semiconductor substrate is provided with a barrier region containing nitrogen atoms formed in the trench, contiguous with the silicon semiconductor substrate surfaces of the trench. The novel isolation trench structure of the invention is formed by first etching an isolation trench in a silicon semiconductor substrate; forming in the isolation trench a barrier region by treating the trench structure with nitrogen atoms from a nitrogen plasma; and then forming a silicon oxide layer over the barrier region in the trench to confine the nitrogen atoms in the barrier region. In a preferred embodiment, a silicon oxide liner is first formed over the silicon semiconductor substrate surfaces of the trench, and then the trench structure is treated with nitrogen atoms from a nitrogen plasma to form, on the silicon semiconductor substrate surfaces of the trench, a barrier layer which contains silicon atoms, oxygen atoms, and nitrogen atoms.

DETAILED DESCRIPTION OF THE INVENTION

The invention comprises an improved isolation trench in a silicon semiconductor substrate having a barrier region containing nitrogen atoms formed in the trench, contiguous with the semiconductor substrate surfaces of the trench. In the preferred embodiment illustrated in FIGS. 1–8 and 14, the novel isolation trench structure of the invention is formed by first forming an isolation trench in a silicon semiconductor substrate; and then forming a silicon oxide liner over the silicon semiconductor substrate surface of the trench. The silicon oxide liner is then treated with nitrogen atoms from a nitrogen plasma to form, on the silicon semiconductor substrate surfaces of the trench, a barrier layer which contains silicon atoms, oxygen atoms, and nitrogen atoms. A silicon oxide layer is then formed over the barrier region in the trench to confine the nitrogen atoms in the barrier region. The remainder of the trench is then filled and the structure is planarized to remove materials from the top surface of the silicon semiconductor substrate, leaving a flat planarized surface on the trench and the adjacent silicon semiconductor substrate.

Figure 1:
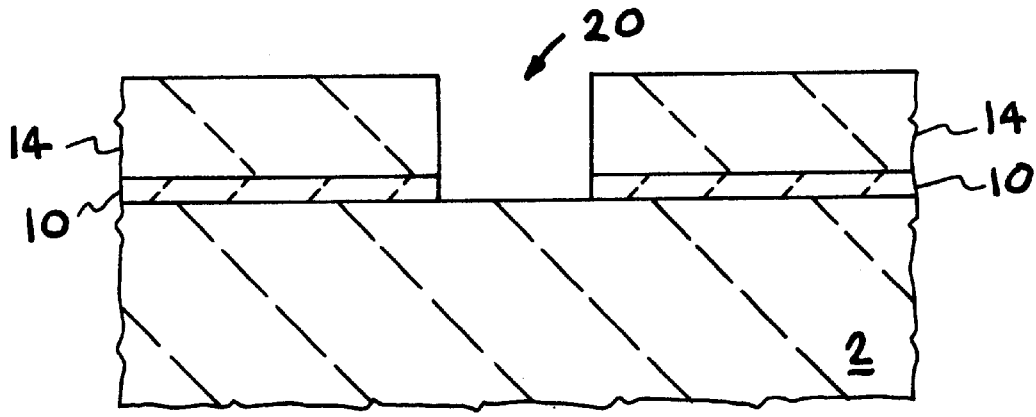
FIG. 1 is a fragmentary vertical cross-section view of a silicon semiconductor substrate having a hard (non-resist) mask formed thereon for the subsequent formation of an isolation trench in the substrate.

Turning now to FIG. 1, a silicon semiconductor substrate 2, such as a single crystal silicon substrate, is shown having a trench mask formed thereon comprising a thin silicon oxide mask layer 10 and a silicon nitride mask layer 14 formed over silicon oxide layer 10. A mask opening, conforming to the desired lateral dimensions of the isolation trench to be etched in silicon semiconductor substrate 2, is cut through mask layers 10 and 14, as indicated at arrow 20, using standard photolithography techniques as are well known to those skilled in the art. Silicon oxide mask layer 10 may be thin, e.g., about 10 nanometers (nm) since its main function is to release the stress of silicon nitride mask layer 14 to substrate 2. Silicon nitride mask layer 14 is formed of a thickness sufficient to protect the masked portion of substrate 2 from exposure to either the etchant system used to form the trench or the nitrogen plasma used in the nitridation step, as will be explained below. Typically, the thickness of silicon nitride mask layer 14 will range from at least about 100 nm up to about 200 nm, with thicker dimensions of silicon nitride mask layer 14 being useful, but not necessary.

Figure 2:
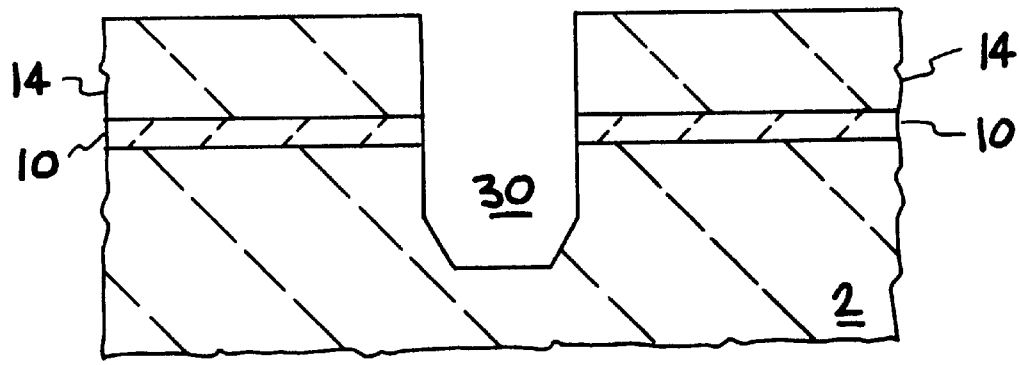
FIG. 2 is a fragmentary vertical cross-sectional view of the structure of FIG. 1 after formation of the trench in the silicon semiconductor substrate through the mask opening.

As shown in FIG. 2, a shallow isolation trench 30 is etched in silicon semiconductor substrate 2, using (preferably) a dry etchant system selective to the silicon nitride mask such as, for example, a reactive ion etch using HBr/Cl chemistry. By use of the term "shallow" with respect to the trench depth is meant a trench having a minimum depth sufficient to provide the desired electrical isolation and a maximum depth not exceeding the depth at which the sidewall and bottom wall surface of the trench may be treated with nitrogen from a nitrogen plasma as will be described below. Within these functional limits, isolation trench 30 may be formed with an aspect ratio (width to depth ratio) ranging from about 1:1 to about 1:4. Typically, the depth of the isolation trench will range from about 0.2 micrometers ($\mu$m) to about 5 $\mu$m.

Figure 3:
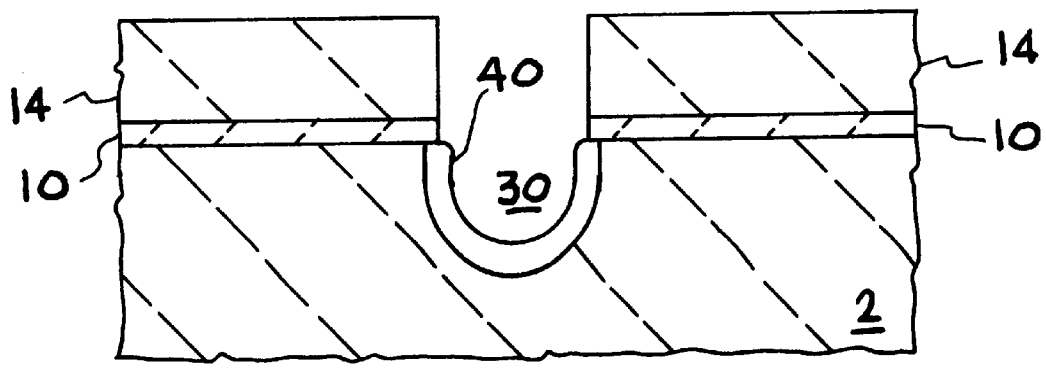
FIG. 3 is a fragmentary vertical cross-sectional view of the structure of FIG. 2 after formation of a silicon oxide liner on the silicon semiconductor substrate surfaces of the trench.
Figure 4:
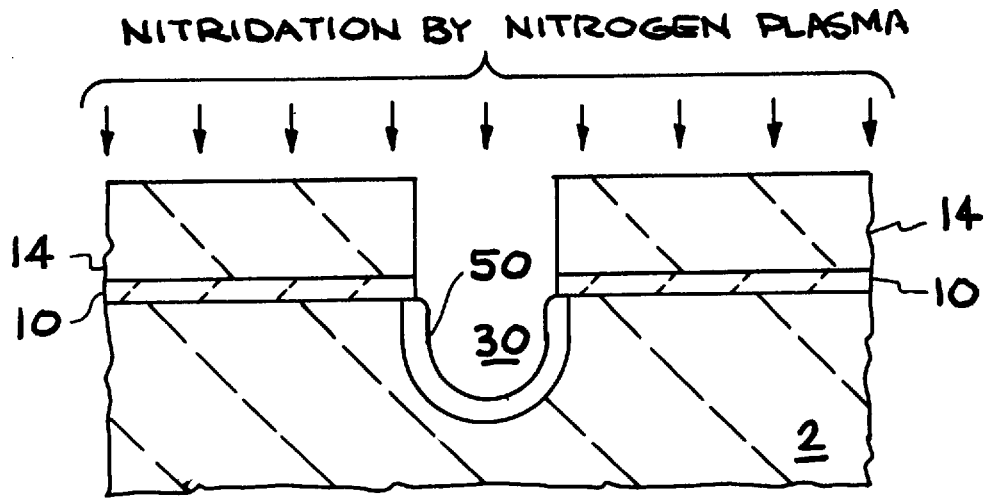
FIG. 4 is a fragmentary vertical cross-sectional view of the structure of FIG. 3 undergoing nitridation by nitrogen atoms from a nitrogen plasma to form a barrier region containing silicon atoms, oxygen atoms, and nitrogen atoms contiguous with the silicon semiconductor substrate surfaces of the trench.

After formation of isolation trench 30 in silicon semiconductor substrate 2, a thin silicon oxide liner 40 is grown in the silicon semiconductor substrate surfaces of trench 30, as shown in FIG. 3. The thickness of silicon oxide liner 40 must be sufficient to supply an oxygen source for the barrier layer containing silicon, oxygen, and nitrogen atoms to be formed in the subsequent nitridation of silicon oxide liner 40, but insufficient to prevent penetration of the nitrogen atoms from the nitrogen plasma through silicon oxide liner 40 to the interface between silicon substrate 2 and silicon oxide liner 40 at the bias level applied to the substrate during the nitridation step. Preferably the thickness of silicon oxide layer 40 will range from about 3.5 nm to about 5 nm.

After formation of trench 30, and thin silicon oxide liner 40 on the silicon semiconductor surfaces of trench 30, the structure is subject to nitridation by nitrogen atoms from a nitrogen plasma to form from liner 40 a barrier region 50 containing silicon, oxygen, and nitrogen atoms which is contiguous with the silicon semiconductor surfaces of trench 30. Barrier region 50 may be termed as a silicon oxynitride barrier region (usually non-stoichiometric). The use of a nitrogen plasma as a source of nitrogen atoms for the nitridation of a silicon layer is described in U.S. Pat. No. 5,837,598, issued Nov. 17, 1998 and entitled "DIFFUSION BARRIER FOR POLYSILICON GATE ELECTRODE OF MOS DEVICE IN INTEGRATED CIRCUIT STRUCTURE, AND METHOD OF MAKING SAME", filed by one of us with others, and assigned to the assignee of this invention, the subject matter of which is hereby incorporated herein by reference.

As discussed in the aforementioned U.S. Ser. No. 08/816,254, the gaseous source of nitrogen for the nitrogen plasma is nitrogen ($N_2$). With nitrogen ($N_2$) as the gaseous source of nitrogen, the flow of gaseous nitrogen, for example, into a plasma chamber of about 6 liters in volume should range from about 20 to about 80 standard cubic centimeters per minute (sccm).

The exposure of silicon oxide layer 40 to the nitrogen plasma may be carried out at room temperature, i.e., at a temperature ranging from about 15° C. to about 30° C., and preferably about 20° C. to about 27° C., although higher temperatures, e.g., as high as 100° C., may be used, if desired. A temperature of about 60° C. has been successfully used to form the barrier layer of silicon and nitrogen. The step of exposing silicon layer 40 to the nitrogen plasma may be carried out in a conventional etching chamber at a pressure low enough to permit plasma generation. A pressure ranging from about 20 milliTorr (mTorr) to about 80 mTorr has been found to be satisfactory.

The energy or power level of the nitrogen plasma should be sufficient to permit the nitrogen atoms to penetrate into silicon oxide layer 40, but insufficient to result in any discernible sputtering of silicon atoms from the surface of silicon layer 40. Power levels which create nitrogen ion species which do not have energy levels exceeding about 100 electron volts (ev) will be satisfactory with regard to the inhibition of sputtering of silicon atoms from silicon layer 40 during the exposure. Depending on the thickness of the oxide and the extent of desired nitridation, the energy level of the nitrogen ions in the plasma will range between about 25 ev and about 100 ev. The use of a 200–500 watt rf plasma source, for example, in combination with an rf bias power of about 5–20 watts electrically coupled to the substrate support in the plasma chamber, will provide the desired amount of energy to the nitrogen ions in the plasma, without resulting in sputtering of the silicon atoms.

The energy of the nitrogen plasma used for the nitridation of silicon oxide liner 40 to form barrier region 50 and the time of exposure are adjusted to be sufficient to enable nitrogen atoms from the nitrogen plasma to penetrate into silicon oxide liner 40 to the interface between liner 40 and silicon substrate 2, so that the entire volume comprising silicon oxide liner 40 is penetrated by nitrogen atoms from the nitrogen plasma to form the desired ratio of silicon to nitrogen atoms in barrier region 50 as previously discussed. The maximum exposure time of substrate 2 to the nitrogen plasma is related to the buildup of charge on the surfaces of substrate 2 which can be tolerated. This can be determined empirically based on the behavior of the parasitic transistors formed in the substrate by such accumulated charge. Preferably a remote nitrogen plasma is used to provide the source of nitrogen atoms for barrier region 50 to limit the amount of accumulated charge from the nitrogen ion plasma on the silicon semiconductor substrate surfaces, as well as to provide a higher level of nitridation compared to other methods such as, for example, a nitrogen implant.

Figure 5:
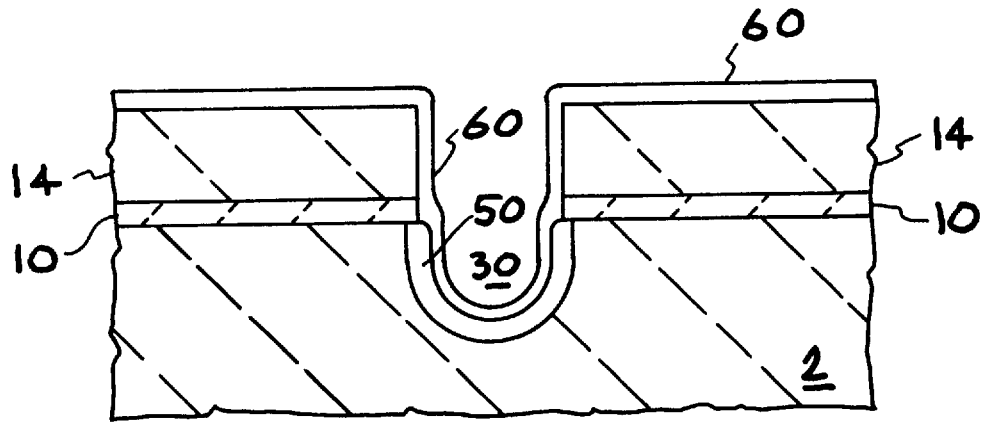
FIG. 5 is a fragmentary vertical cross-sectional view of the structure of FIG. 4 after formation of a silicon layer over the barrier region containing the silicon, oxygen, and nitrogen atoms.
Figure 6:
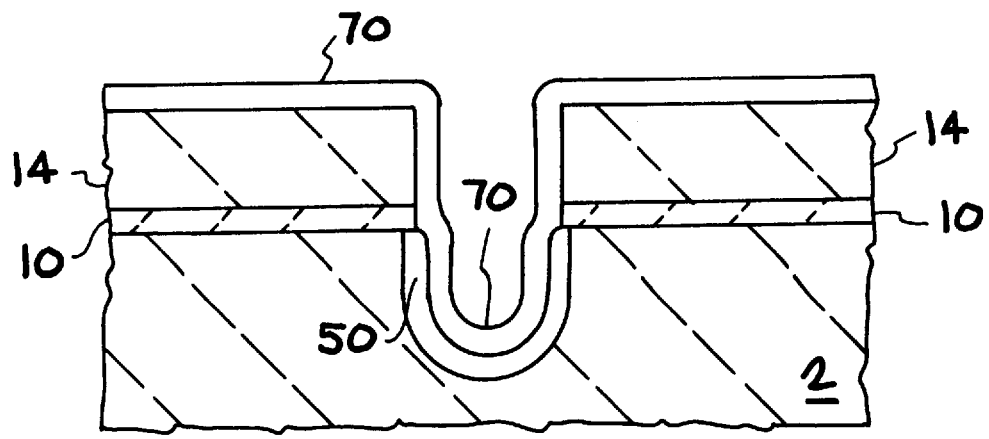
FIG. 6 is a fragmentary vertical cross-sectional view of the structure of FIG. 5 after thermal oxidation of the silicon layer to form a silicon oxide barrier layer over the barrier region.

After nitridation of silicon oxide layer 40 to form barrier region 50, a silicon oxide layer is formed over barrier region 50 to confine the nitrogen atoms in barrier region 50 from diffusing to other filler materials in trench 30. In a preferred embodiment, as shown in FIGS. 5 and 6, this silicon oxide barrier layer is preferably formed by first blanket depositing an amorphous silicon layer 60 over the exposed portions of substrate 2 and barrier region 50 in trench 30, as shown in FIG. 5. Amorphous silicon layer 60 is then oxidized, e.g., by thermal oxidation, to form from amorphous silicon layer 60 a silicon oxide layer 70 over barrier region 50, as shown in FIG. 6.

The thickness of amorphous silicon layer 60 will control the thickness of silicon oxide layer 70 which is formed over barrier region 50, since amorphous silicon layer 60 is the sole source of silicon for silicon oxide layer 70 (the silicon from silicon semiconductor substrate 2 will not penetrate silicon oxynitride barrier region 50). To provide for a silicon oxide layer 70 to range in thickness from about 11 nm to about 48 nm, the thickness of amorphous silicon layer 60 should range from about 5 nm to about 22 nm (the thickness of a silicon oxide layer formed from the oxidation of silicon is about 2.2 times the original thickness of the silicon). This will provide for a total thickness of silicon oxynitride barrier region 50 plus silicon oxide layer 70 ranging from about 14.5 nm (3.5 nm+11 nm) to about 53 nm (5 nm+48 nm).

Figure 7:
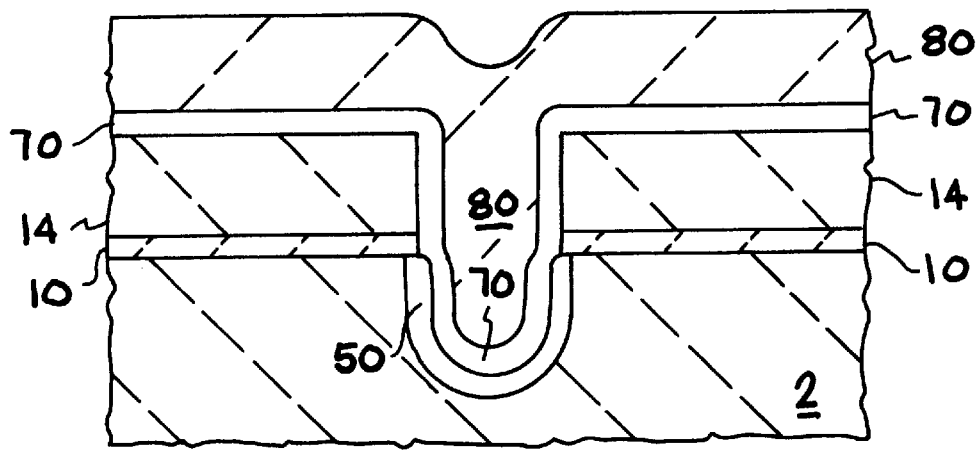
FIG. 7 is a fragmentary vertical cross-sectional view of the structure of FIG. 6 after completion of the filling of the trench.

Following the formation of silicon oxide layer 70 over barrier region 50, the remainder of trench 30 may be filled, as shown in FIG. 7, using any filler material 80 compatible with the remainder of the integrated circuit structure. This could comprise formation of a further silicon oxide layer 80 over the entire structure or the deposition of a layer of other filler materials such as undoped polysilicon if the use of oxide filler material will result in the creation of undesirable stress in trench 30.

Figure 8:
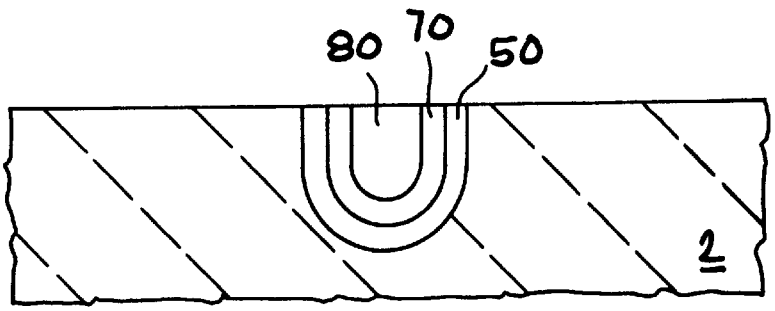
FIG. 8 is a fragmentary vertical cross-sectional view of the structure of FIG. 7 after planarizaton of the integrated circuit structure to achieve a flat semiconductor substrate surface.

After completion of the filling of the remainder of trench 30 with filler material 80, the structure is subjected to a planarization process, such as a chemical/mechanical polishing (CMP) process, to remove materials deposited on the top surface of substrate 2, as well as materials protruding from trench 30, leaving a planarized structure as shown in FIG. 8 with the top surface of substrate 2 even with the top surface of filled trench 30.

Figure 9:
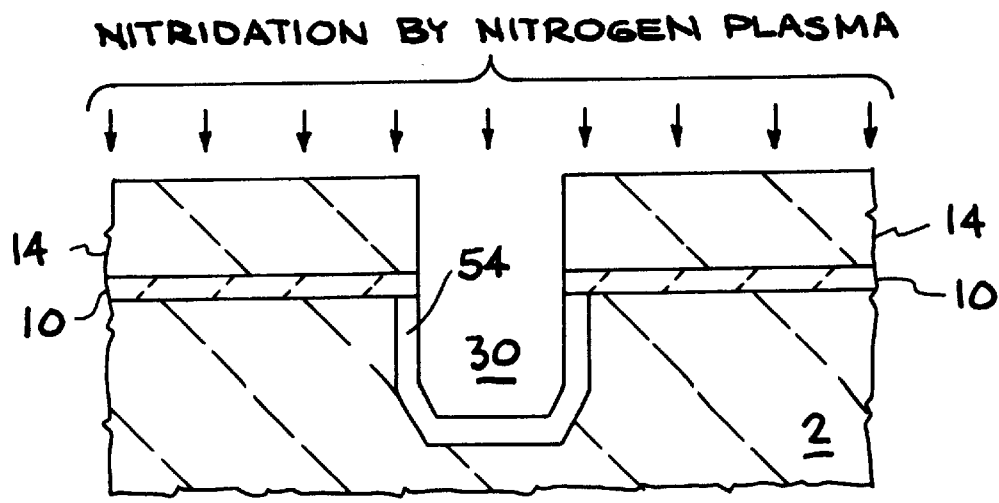
FIG. 9 is a fragmentary vertical cross-sectional view of the structure of FIG. 2 illustrating a second embodiment of the invention wherein, without the prior formation of a silicon oxide liner on the surfaces of the trench, the silicon semiconductor substrate surfaces of the trench are shown undergoing nitridation by nitrogen atoms from a nitrogen plasma to form a barrier region containing silicon atoms and nitrogen atoms contiguous with the silicon semiconductor substrate surfaces of the trench.

Turning now to FIGS. 9–13, another embodiment of the invention is illustrated wherein the formation of initial silicon oxide liner 40 is omitted and the silicon semiconductor substrate surfaces of the trench are, instead, directly subject to the nitridation step. In this embodiment, the initial steps illustrated in FIGS. 1 and 2 are repeated to form trench 30 in silicon semiconductor substrate 2 through opening 20 in mask layers 10 and 14. However, as shown in FIG. 9, in this embodiment, the silicon semiconductor substrate surfaces of the trench structure are now directly subject to the nitridation step by nitrogen atoms from a nitrogen plasma to thereby incorporate nitrogen atoms into the silicon semiconductor substrate adjacent the silicon surfaces of the trench. This incorporation of nitrogen atoms into the silicon surfaces of the trench results in the formation of a silicon/nitrogen barrier region 54 adjacent the silicon surfaces of the trench having a peak concentration of nitrogen within a few atomic layers of the silicon substrate surface (i.e., about 2–10 atomic layers from the surface). Silicon/nitrogen barrier region 54 then functions as a barrier to the diffusion of dopant from substrate 2 into the materials in trench 30. Silicon/nitrogen barrier region 54 may be termed a silicon nitride type structure having the formula $Si_wN_z$, where the values of w and z are such that the peak concentration of nitrogen in the silicon semiconductor substrate is about 10–30 atomic percent (~$5 \times 10^{21}$ nitrogen atoms/cm$^3$).

Figure 10:
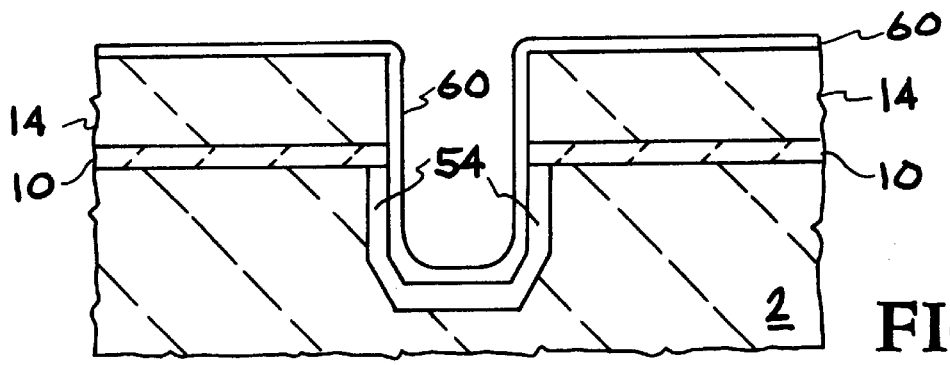
FIG. 10 is a fragmentary vertical cross-sectional view of the structure of FIG. 9 after formation of a silicon layer over the barrier region containing the silicon and nitrogen atoms.
Figure 11:
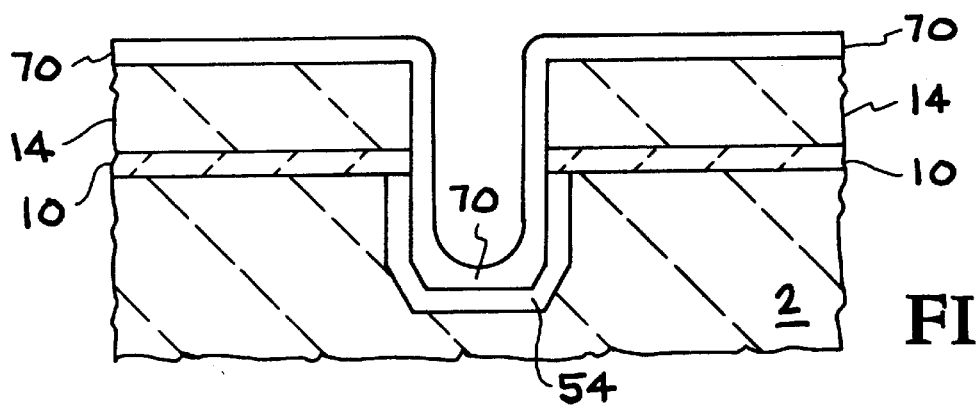
FIG. 11 is a fragmentary vertical cross-sectional view of the structure of FIG. 10 after thermal oxidation of the silicon layer to form a silicon oxide layer over the barrier region.

As shown in FIG. 10, after subjecting the silicon semiconductor substrate trench surfaces to nitridation to form silicon/nitrogen barrier region 54, an amorphous silicon layer 60 is blanket deposited over the structure, as in the step of the previous embodiment illustrated in FIG. 5. Amorphous silicon layer 60 is then oxidized, as shown in FIG. 11, to form silicon oxide layer 70 which, similar to the previous embodiment, functions to confine the nitrogen atoms in silicon/nitrogen barrier region 54 from migrating into other materials in trench 30. The thicknesses of amorphous silicon layer 60, and the resulting silicon oxide layer 70 formed by the oxidation of amorphous silicon layer 60, may be the same as in the previous embodiment.

Figure 12:
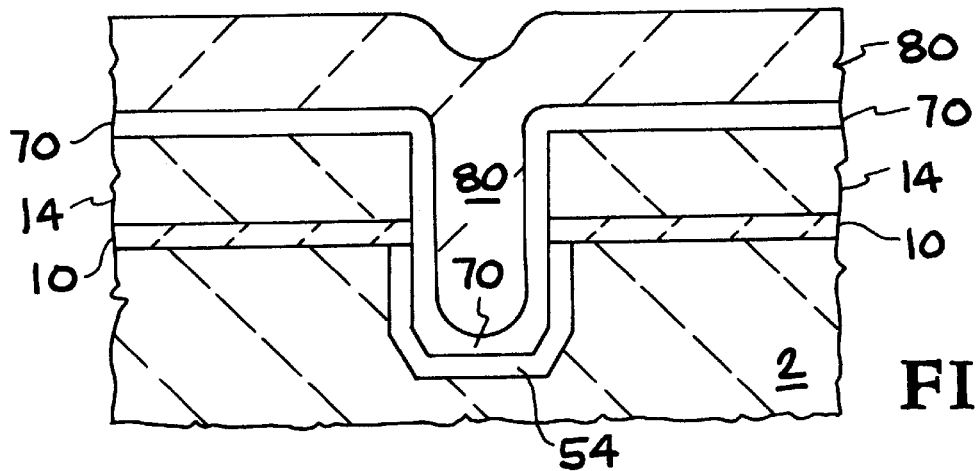
FIG. 12 is a fragmentary vertical cross-sectional view of the structure of FIG. 11 after completion of the filling of the trench.
Figure 13:
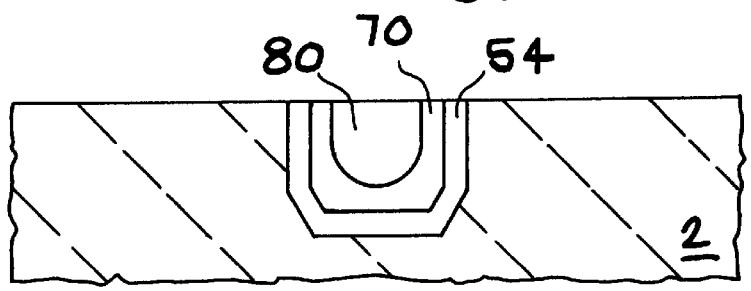
FIG. 13 is a fragmentary vertical cross-sectional view of the structure of FIG. 12 after planarization of the integrated circuit structure to achieve a flat semiconductor substrate surface.
Figure 14:
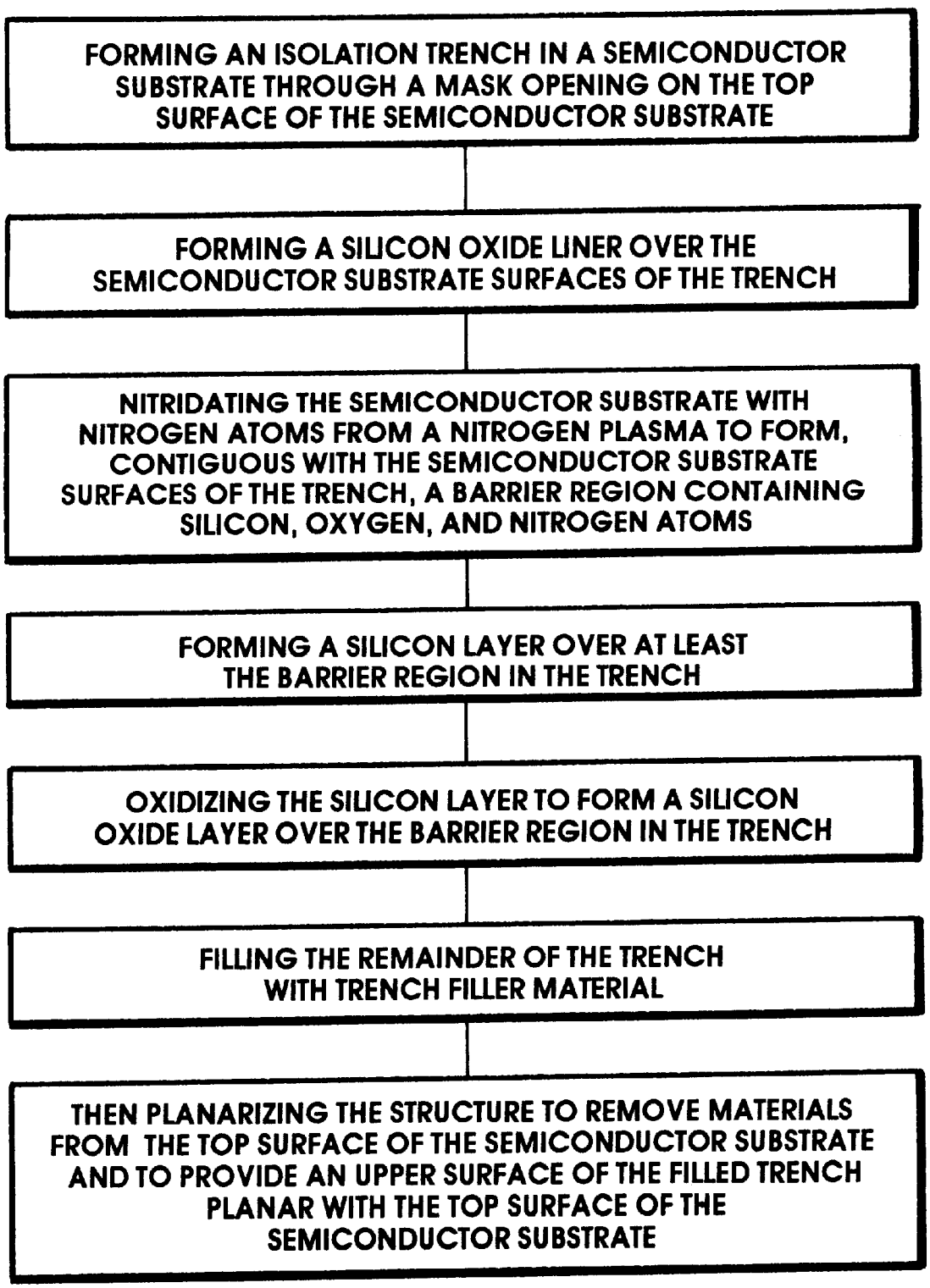
FIG. 14 is a flowsheet of the preferred embodiment of the process of the invention as illustrated in FIGS. 1–8.

As shown in FIG. 12, after oxidation of amorphous silicon layer 60 to form silicon oxide layer 70, the remainder of trench 30 is then filled with filler material 80, as in the previous embodiment, and then subject to a planarization step, such as a CMP step, resulting in the planarized structure shown in FIG. 13.

The following examples will serve to better illustrate the invention.

EXAMPLE 1

To illustrate the formation of an isolation trench having a silicon oxynitride barrier region therein, a thin (10 nm thick) silicon oxide mask layer can be first formed over a single crystal silicon semiconductor substrate followed by formation of a 150 nm silicon nitride mask layer over the silicon oxide layer. A 300 nm mask opening is formed in both the silicon oxide and silicon nitride mask layers using conventional photolithography to form a photoresist mask over the oxide and nitride mask layers. A 0.3 µm deep trench can then be etched in the silicon substrate through the mask layers using a reactive ion etch system. A 3.5 nm silicon oxide liner is then formed on the silicon semiconductor substrate surface of the trench. The structure is then exposed to a remote nitrogen plasma at a power level of 200 watts for a period of about 0.3 minutes, while maintaining the pressure at about 20 mtorr to nitridate the silicon oxide liner to form a barrier region containing silicon, oxygen, and nitrogen atoms, i.e., a silicon oxynitride barrier region.

After formation of the nitrogen-containing barrier region, a 5.2 nm thick amorphous silicon layer will be deposited over the entire structure including the barrier region in the trench. This amorphous silicon layer is then subject to a thermal oxidation to form a 11.5 nm thick silicon oxide layer over the structure, including the silicon oxynitride barrier region in the trench to thereby confine the nitrogen atoms in the barrier region.

The remainder of the trench is then filled by depositing silicon oxide therein and the entire structure can then be planarized by CMP to remove all of the trench filler materials from the top surface of the silicon semiconductor substrate and to provide a smooth surface over the filled trench level with the remainder of the top surface of the substrate.

The resulting isolation structure can then be tested by the formation of MOS devices on either side of the isolation trench which are then tested to determine the performance of the MOS devices with respect to both Reverse Narrow Width Effect and field punchthrough. In each instance, the isolation structure formed in accordance with the invention will be found to perform in a superior manner to an isolation trench filled with only silicon oxide.

EXAMPLE 2

To also illustrate the formation of an isolation trench having a silicon nitride barrier region therein, a 0.3 µm deep trench can again be formed in a silicon semiconductor substrate following the procedures of Example 1. Without the formation of any silicon oxide liner the structure is then exposed to a remote nitrogen plasma at a power level of 200 watts for a period of about 0.3 minutes, while maintaining the pressure at about 20 mtorr to nitridate the silicon surfaces of the trench to form a barrier region containing silicon and nitrogen atoms, i.e., a silicon nitride barrier region.

As in Example 1, after formation of the nitrogen-containing barrier region, a 6.8 nm thick amorphous silicon layer will be deposited over the entire structure including the barrier region in the trench. This amorphous silicon layer is then subjected to a thermal oxidation to form a 15 nm thick silicon oxide layer over the structure, including the silicon nitride barrier region in the trench to thereby confine the nitrogen atoms in the barrier region.

The remainder of the trench is then filled, as in Example 1, by depositing silicon oxide therein and the entire structure can then be planarized by CMP to remove all of the trench filler materials from the top surface of the silicon semiconductor substrate and to provide a smooth surface over the filled trench level with the remainder of the top surface of the substrate.

The resulting isolation structure can then be tested as in Example 1. The isolation trench having the silicon nitride barrier region will again be found to perform in a superior manner to an isolation trench filled with only silicon oxide.

In either embodiment, the nitridation step results in the formation of a barrier region containing silicon and nitrogen atoms contiguous with the silicon semiconductor substrate surfaces of the trench. The presence of a barrier region containing nitrogen atoms contiguous with the silicon semiconductor substrate trench surfaces acts to suppress the Reverse Narrow Width Effect (RNWE) in CMOS structures constructed in the silicon semiconductor substrate adjacent the barrier region and the isolation trench. Additionally, the field punchthrough protection is improved because the dopants in the silicon semiconductor substrate adjacent to the barrier region of the isolation structure are not able to diffuse into the nitrogen-containing barrier region and therefore the interface concentration will be higher than that of a standard oxide liner in an isolation trench where depletion occurs at the interface.

Having thus described the invention what is claimed is:

1. A process for forming an improved isolation trench in a silicon semiconductor substrate containing nitrogen atoms formed in said trench which comprises:
   a) forming an isolation trench in a silicon semiconductor substrate;
   b) forming in said isolation trench a barrier region by treating said trench structure with nitrogen atoms from a nitrogen plasma, said barrier region formed contiguous with the silicon semiconductor substrate surfaces of said isolation trench; and
   c) forming a silicon oxide layer over said barrier region in said trench to confine said nitrogen atoms in said barrier region be the steps of:
      i) forming an amorphous silicon layer over said barrier region in said trench, and
      ii) then oxidizing said layer of amorphous silicon to form said layer of silicon oxide over said barrier region in said trench.

2. The process of claim 1 wherein said barrier region formed by treating said trench structure with nitrogen atoms from a nitrogen plasma comprises a barrier region consisting essentially of silicon atoms and nitrogen atoms formed by treating the silicon semiconductor substrate surfaces of said trench structure with nitrogen atoms.

3. The process of claim 1 wherein said step of forming said barrier region further comprises the initial step of forming a silicon oxide liner on the silicon semiconductor substrate surfaces of said trench, and then treating said trench structure with said nitrogen atoms from said nitrogen plasma to form a barrier region on said silicon semiconductor substrate surfaces of said trench containing silicon atoms, oxygen atoms, and nitrogen atoms.

4. The process of claim 1 wherein said step of forming said barrier region further comprises:
   a) forming a first silicon oxide layer over the silicon semiconductor substrate surfaces in said trench;
   b) then treating said first silicon oxide layer with said nitrogen atoms from said nitrogen plasma to form on said surfaces of said trench a barrier region containing silicon atoms, oxygen atoms, and nitrogen atoms.

5. The process of claim 1 wherein said step of treating said trench structure with said nitrogen atoms from said nitrogen plasma further comprises treating said trench structure with nitrogen atoms from a remote nitrogen plasma.

6. A process for forming an improved isolation trench in a silicon semiconductor substrate comprising a barrier region formed in said trench which inhibits penetration of dopant from said silicon semiconductor substrate into said isolation trench which comprises:
   a) forming an isolation trench in a silicon semiconductor substrate;
   b) forming a first silicon oxide layer over the silicon semiconductor substrate surfaces in said trench;
   c) then treating said first silicon oxide layer with nitrogen atoms from a nitrogen plasma to form on said silicon semiconductor substrate surfaces of said trench a barrier region containing silicon atoms, oxygen atoms, and nitrogen atoms, said barrier region contiguous with the surfaces of said isolation trench; and
   d) then forming a second silicon oxide layer over said barrier region in said trench to act as a cap layer to confine said nitrogen atoms in said barrier region said second silicon oxide layer formed by the steps of:

i) forming an amorphous silicon layer over said barrier region in said trench; and
  ii) then oxidizing said layer of amorphous silicon to form said layer of silicon oxide over said barrier region in said trench.

7. The process of claim 6 wherein said step of treating said trench structure with said nitrogen atoms from said nitrogen plasma further comprises treating said trench structure with nitrogen atoms from a remote nitrogen plasma.

8. The process of claim 6 wherein said step of treating said first silicon oxide layer with nitrogen atoms from a nitrogen plasma to form said barrier region containing silicon atoms, oxygen atoms, and nitrogen atoms further comprises forming a barrier region comprising a silicon oxynitride barrier region.

9. The process of claim 6 wherein the thickness of said silicon oxynitride barrier region ranges from about 3.5 nm to about 5 nm.

10. The process of claim 6 wherein the thickness of said silicon oxide barrier layer ranges from about 11 nm to about 48 nm.

11. The process of claim 6 including the further step of filling the remainder of said trench with a filler material.

12. The process of claim 6 wherein said step of filling the remainder of said trench with a filler material comprises filling the remainder of said trench with silicon oxide.

13. The process of claim 6 wherein said step of filling the remainder of said trench with a filler material comprises filling the remainder of said trench with silicon.

14. The process of claim 6 wherein said isolation trench is formed with an aspect ratio ranging from about 1:1 to about 1:4.

15. An improved isolation trench in a silicon semiconductor substrate comprising a barrier region containing nitrogen atoms in said trench which comprises:
  a) an isolation trench formed in a silicon semiconductor substrate;
  b) a barrier region containing nitrogen atoms formed in said isolation trench by treating said trench structure with nitrogen atoms from a nitrogen plasma, said barrier region formed contiguous with the silicon semiconductor substrate surfaces of said isolation trench; and
  c) a silicon oxide layer formed over said barrier region in said trench to confine said nitrogen atoms in said barrier region, said silicon oxide layer comprising an amorphous silicon layer formed over said barrier region in said trench and then oxidized to form said layer of silicon oxide over said barrier region in said trench.

16. The isolation trench of claim 15 wherein said barrier region consists essentially of silicon atoms and nitrogen atoms formed by treating the silicon semiconductor substrate surfaces of said trench structure with said nitrogen atoms from said nitrogen plasma.

17. The isolation trench of claim 15 wherein said barrier region consists essentially of silicon atoms, oxygen atoms, and nitrogen atoms formed by first forming a silicon oxide layer over the silicon semiconductor substrate surfaces in said trench, and then treating said silicon oxide layer with said nitrogen atoms from said nitrogen plasma to form on said silicon semiconductor surfaces of said trench said barrier region containing said silicon atoms, oxygen atoms, and nitrogen atoms.

\* \* \* \* \*